(12) United States Patent
Kim

(10) Patent No.: US 9,183,913 B2
(45) Date of Patent: Nov. 10, 2015

(54) METHODS OF OPERATING A MAGNETIC MEMORY DEVICE

(71) Applicant: Daeshik Kim, Hwaseong-si (KR)

(72) Inventor: Daeshik Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/295,452

(22) Filed: Jun. 4, 2014

(65) Prior Publication Data

US 2015/0063018 A1   Mar. 5, 2015

(30) Foreign Application Priority Data

Aug. 29, 2013 (KR) ................ 10-2013-0103463

(51) Int. Cl.
*G11C 11/16* (2006.01)
*G11C 13/00* (2006.01)
*G11C 11/56* (2006.01)

(52) U.S. Cl.
CPC ........ *G11C 11/1675* (2013.01); *G11C 13/0069* (2013.01); *G11C 2213/79* (2013.01)

(58) Field of Classification Search
CPC ................ G11C 11/1675; G11C 13/0069
USPC ................. 365/158, 189.011, 66
See application file for complete search history.

(56) References Cited

U.S. PATENT DOCUMENTS

| | | | |
|---|---|---|---|
| 7,436,698 B2 | 10/2008 | Lin et al. | |
| 7,672,175 B2 | 3/2010 | Yoon et al. | |
| 7,755,932 B2 | 7/2010 | Ito et al. | |
| 7,969,767 B2 | 6/2011 | Li et al. | |
| 8,144,509 B2 | 3/2012 | Jung et al. | |
| 8,432,727 B2 | 4/2013 | Ryu et al. | |
| 2002/0018360 A1* | 2/2002 | Hartmann | 365/158 |
| 2005/0007815 A1* | 1/2005 | Adelmann | 365/158 |
| 2007/0279978 A1* | 12/2007 | Ho et al. | 365/173 |
| 2009/0103354 A1 | 4/2009 | Yoon et al. | |
| 2010/0220516 A1 | 9/2010 | Lee et al. | |
| 2013/0028011 A1 | 1/2013 | Kitagawa et al. | |

* cited by examiner

*Primary Examiner* — Ly D Pham
(74) *Attorney, Agent, or Firm* — Myers Bigel Sibley & Sajovec, PA

(57) ABSTRACT

Provided is a data writing method of a magnetic memory device. The method may include flowing first and second currents near left and right sides, respectively, of a selected memory cell to apply an ambient magnetic field to the selected memory cell. Here, directions of the first and second currents may be anti-parallel to each other.

18 Claims, 26 Drawing Sheets

Fig. 11

|  | P-to-AP | AP-to-P |
|---|---|---|
| $BL_{n-5}$ | | |
| $BL_{n-4}$ | | |
| $BL_{n-3}$ | | |
| $BL_{n-2}$ | | |
| $BL_{n-1}$ | ⇐ | ⇒ |
| $BL_{n+0}$ | $I_{Write}$ | $-I_{Write}$ |
| $BL_{n+1}$ | ⇒ | ⇐ |
| $BL_{n+2}$ | | |
| $BL_{n+3}$ | | |
| $BL_{n+4}$ | | |
| $BL_{n+5}$ | | |
| $BL_{n+6}$ | | |
| $H_{amp}$ | ↑ | ↓ |

Fig. 12

| | P-to-AP | AP-to-P |
|---|---|---|
| $BL_{n-5}$ | | |
| $BL_{n-4}$ | ⇐ | ⇒ |
| $BL_{n-3}$ | ⇐ | ⇒ |
| $BL_{n-2}$ | ⇐ | ⇒ |
| $BL_{n-1}$ | ⇐ | ⇒ |
| $BL_{n+0}$ | $I_{Write}$ | $-I_{Write}$ |
| $BL_{n+1}$ | ⇒ | ⇐ |
| $BL_{n+2}$ | ⇒ | ⇐ |
| $BL_{n+3}$ | ⇒ | ⇐ |
| $BL_{n+4}$ | ⇒ | ⇐ |
| $BL_{n+5}$ | | |
| $BL_{n+6}$ | | |
| $H_{amp}$ | ↑ | ↓ |

Fig. 13

| | P-to-AP | AP-to-P |
|---|---|---|
| $BL_{n-5}$ | | |
| $BL_{n-4}$ | | ⇒ |
| $BL_{n-3}$ | | ⇒ |
| $BL_{n-2}$ | | ⇒ |
| $BL_{n-1}$ | | ⇒ |
| $BL_{n+0}$ | $I_{Write}$ | $-I_{Write}$ |
| $BL_{n+1}$ | | ⇐ |
| $BL_{n+2}$ | | ⇐ |
| $BL_{n+3}$ | | ⇐ |
| $BL_{n+4}$ | | ⇐ |
| $BL_{n+5}$ | | |
| $BL_{n+6}$ | | |
| $H_{amp}$ | None | ↓ |

Fig. 14

|  | P-to-AP | AP-to-P |
|---|---|---|
| $BL_{n-5}$ | | |
| $BL_{n-4}$ | | ⇒ |
| $BL_{n-3}$ | | ⇒ |
| $BL_{n-2}$ | | ⇒ |
| $BL_{n-1}$ | ⇐ | ⇒ |
| $BL_{n+0}$ | $I_{Write}$ | $-I_{Write}$ |
| $BL_{n+1}$ | ⇒ | ⇐ |
| $BL_{n+2}$ | | ⇐ |
| $BL_{n+3}$ | | ⇐ |
| $BL_{n+4}$ | | ⇐ |
| $BL_{n+5}$ | | |
| $BL_{n+6}$ | | |
| $H_{amp}$ | ↑ | ↓ |

Fig. 17

|  | P-to-AP | AP-to-P |
|---|---|---|
| $AL_{n-3}$ | | |
| $BL_{n-2}$ | | |
| $AL_{n-2}$ | | |
| $BL_{n-1}$ | | |
| $AL_{n-1}$ | ⇐ | ⇒ |
| $BL_{n+0}$ | $I_{Write}$ | $-I_{Write}$ |
| $AL_{n+1}$ | ⇒ | ⇐ |
| $BL_{n+1}$ | | |
| $AL_{n+2}$ | | |
| $BL_{n+2}$ | | |
| $AL_{n+3}$ | | |
| $BL_{n+3}$ | | |
| $H_{amp}$ | ↑ | ↓ |

Fig. 18

|  | P-to-AP | AP-to-P |
|---|---|---|
| $AL_{n-3}$ | | |
| $BL_{n-2}$ | | |
| $AL_{n-2}$ | ← | → |
| $BL_{n-1}$ | | |
| $AL_{n-1}$ | ← | → |
| $BL_{n+0}$ | $I_{Write}$ | $-I_{Write}$ |
| $AL_{n+1}$ | → | ← |
| $BL_{n+1}$ | | |
| $AL_{n+2}$ | → | ← |
| $BL_{n+2}$ | | |
| $AL_{n+3}$ | | |
| $BL_{n+3}$ | | |
| $H_{amp}$ | ↑ | ↓ |

Fig. 19

|  | P-to-AP | AP-to-P |
|---|---|---|
| $AL_{n-3}$ | | |
| $BL_{n-2}$ | | |
| $AL_{n-2}$ | ⇐ | ⇒ |
| $BL_{n-1}$ | ⇐ | ⇒ |
| $AL_{n-1}$ | ⇐ | ⇒ |
| $BL_{n+0}$ | $I_{Write}$ | $-I_{Write}$ |
| $AL_{n+1}$ | ⇒ | ⇐ |
| $BL_{n+1}$ | ⇒ | ⇐ |
| $AL_{n+2}$ | ⇒ | ⇐ |
| $BL_{n+2}$ | | |
| $AL_{n+3}$ | | |
| $BL_{n+3}$ | | |
| $H_{amp}$ | ↑ | ↓ |

Fig. 22

|  | P-to-AP | AP-to-P |
|---|---|---|
| $BL_{n-5}$ | | |
| $BL_{n-4}$ | | |
| $BL_{n-3}$ | | |
| $BL_{n-2}$ | | |
| $BL_{n-1}$ | ⇐ | ⇒ |
| $BL_{n+0}$ | $V_{Write}$ | $V_{Write}$ |
| $BL_{n+1}$ | ⇒ | ⇐ |
| $BL_{n+2}$ | | |
| $BL_{n+3}$ | | |
| $BL_{n+4}$ | | |
| $BL_{n+5}$ | | |
| $BL_{n+6}$ | | |
| $H_{amp}$ | ↑ | ↓ |
| $E_{amp}$ | ↑ | ↑ |

Fig. 23

|  | P-to-AP | AP-to-P |
|---|---|---|
| $BL_{n-5}$ | | |
| $BL_{n-4}$ | ← | → |
| $BL_{n-3}$ | ← | → |
| $BL_{n-2}$ | ← | → |
| $BL_{n-1}$ | ← | → |
| $BL_{n+0}$ | $V_{Write}$ | $V_{Write}$ |
| $BL_{n+1}$ | → | ← |
| $BL_{n+2}$ | → | ← |
| $BL_{n+3}$ | → | ← |
| $BL_{n+4}$ | → | ← |
| $BL_{n+5}$ | | |
| $BL_{n+6}$ | | |
| $H_{amp}$ | ↑ | ↓ |
| $E_{amp}$ | ↑ | ↑ |

Fig. 24

|  | P-to-AP | AP-to-P |
|---|---|---|
| $BL_{n-5}$ |  |  |
| $BL_{n-4}$ |  | ⇒ |
| $BL_{n-3}$ |  | ⇒ |
| $BL_{n-2}$ |  | ⇒ |
| $BL_{n-1}$ | ⇐ | ⇒ |
| $BL_{n+0}$ | $V_{Write}$ | $V_{Write}$ |
| $BL_{n+1}$ | ⇒ | ⇐ |
| $BL_{n+2}$ |  | ⇐ |
| $BL_{n+3}$ |  | ⇐ |
| $BL_{n+4}$ |  | ⇐ |
| $BL_{n+5}$ |  |  |
| $BL_{n+6}$ |  |  |
| $H_{amp}$ | ↑ | ↓ |
| $E_{amp}$ | ↑ | ↑ |

Fig. 25

|  | P-to-AP | AP-to-P |
|---|---|---|
| $AL_{n-3}$ | | |
| $BL_{n-2}$ | | |
| $AL_{n-2}$ | | |
| $BL_{n-1}$ | | |
| $AL_{n-1}$ | ⇐ | ⇒ |
| $BL_{n+0}$ | $V_{Write}$ | $V_{Write}$ |
| $AL_{n+1}$ | ⇒ | ⇐ |
| $BL_{n+1}$ | | |
| $AL_{n+2}$ | | |
| $BL_{n+2}$ | | |
| $AL_{n+3}$ | | |
| $BL_{n+3}$ | | |
| $H_{amp}$ | ↑ | ↓ |
| $E_{amp}$ | ↑ | ↑ |

Fig. 26

|  | P-to-AP | AP-to-P |
|---|---|---|
| $AL_{n-3}$ |  |  |
| $BL_{n-2}$ |  |  |
| $AL_{n-2}$ | ⇐ | ⇒ |
| $BL_{n-1}$ |  |  |
| $AL_{n-1}$ | ⇐ | ⇒ |
| $BL_{n+0}$ | $V_{Write}$ | $V_{Write}$ |
| $AL_{n+1}$ | ⇒ | ⇐ |
| $BL_{n+1}$ |  |  |
| $AL_{n+2}$ | ⇒ | ⇐ |
| $BL_{n+2}$ |  |  |
| $AL_{n+3}$ |  |  |
| $BL_{n+3}$ |  |  |
| $H_{amp}$ | ↑ | ↓ |
| $E_{amp}$ | ↑ | ↑ |

Fig. 27

|  | P-to-AP | AP-to-P |
|---|---|---|
| $AL_{n-3}$ | | |
| $BL_{n-2}$ | | |
| $AL_{n-2}$ | ← | → |
| $BL_{n-1}$ | ← | → |
| $AL_{n-1}$ | ← | → |
| $BL_{n+0}$ | $V_{Write}$ | $V_{Write}$ |
| $AL_{n+1}$ | → | ← |
| $BL_{n+1}$ | → | ← |
| $AL_{n+2}$ | → | ← |
| $BL_{n+2}$ | | |
| $AL_{n+3}$ | | |
| $BL_{n+3}$ | | |
| $H_{amp}$ | ↑ | ↓ |
| $E_{amp}$ | ↑ | ↑ |

METHODS OF OPERATING A MAGNETIC MEMORY DEVICE

CROSS-REFERENCE TO RELATED APPLICATIONS

This U.S. non-provisional patent application claims priority under 35 U.S.C. §119 to Korean Patent Application No. 10-2013-0103463, filed on Aug. 29, 2013, in the Korean Intellectual Property Office, the entire contents of which are hereby incorporated by reference.

BACKGROUND OF THE INVENTION

Example embodiments of the inventive concept relate to methods of operating a magnetic memory device.

With increasing use of portable computing devices and wireless communication devices, memory devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of a magnetic tunnel junction (MTJ). For example, a magnetic memory device with a MTJ has been developed such that an MTJ may have a TMR ratio of several hundred to several thousand percent.

SUMMARY

Example embodiments of the inventive concept provide operation methods capable of reducing energy consumption of a magnetic memory device.

Other example embodiments of the inventive concept provide operation methods capable of canceling a stray field in a magnetic memory device.

Still other example embodiments of the inventive concept provide operation methods capable of realizing a voltage-induced magnetization switching.

According to example embodiments of the inventive concept, a data writing method of a magnetic memory device may include flowing first and second currents near left and right sides, respectively, of a selected memory cell to apply an ambient magnetic field to the selected memory cell. Here, directions of the first and second currents may be anti-parallel to each other.

In example embodiments, the selected memory cell may include a magnetic-tunnel junction including a free layer, a fixed layer, and a tunnel barrier therebetween, and at least one of the free layer or the fixed layer may be configured to exhibit a perpendicular magnetization property.

In example embodiments, the magnetic memory device may further include a selected bit line connected to the selected memory cell, left wiring lines provided at a left side of the selected bit line, and right wiring lines provided at a right side of the selected bit line. The first current may be formed to flow through at least one of the left wiring lines adjacent to the selected bit line, and the second current may be formed to flow through at least one of the right wiring lines adjacent to the selected bit line.

In example embodiments, the left and right wiring lines may be parallel to the selected bit line.

In example embodiments, the magnetic memory device may further include non-selected memory cells provided at left and right sides of the selected memory cell, and each of the left and right wiring lines serves as a non-selected bit line electrically connecting some of the non-selected memory cells arranged along a direction parallel to the selected bit line.

In example embodiments, the magnetic memory device may further include non-selected memory cells provided at left and right sides of the selected memory cell, and non-selected bit lines connected to the non-selected memory cells. Each of the left and right wiring lines may be disposed between the non-selected bit lines or between the selected and non-selected bit lines and may be electrically separated from the selected and non-selected memory cells.

In example embodiments, the data writing method may include AP-to-P and P-to-AP writing operations changing data stored in the selected memory cell, the AP-to-P writing operation may be performed to apply the ambient magnetic field having a first magnitude and a first direction to the selected memory cell, and the P-to-AP writing operation may be performed to apply the ambient magnetic field having a second magnitude and a second direction to the selected memory cell. The first and second directions may be anti-parallel to each other.

In example embodiments, the first and second magnitudes may be substantially the same. In other example embodiments, the first and second magnitudes may be different from each other within a range capable of preventing data stored in the selected memory cell from being changed.

In example embodiments, the data writing method may include AP-to-P and P-to-AP writing operations changing data stored in the selected memory cell. One of the AP-to-P and P-to-AP writing operations may be performed to apply the ambient magnetic field having a finite magnitude to the selected memory cell, and the other may be performed without applying the ambient magnetic field to the selected memory cell.

In example embodiments, the magnetic memory device may further include a selected bit line and a source line that may be connected to opposite terminals, respectively, of the selected memory cell, and the data writing method may include operations of changing data stored in the selected memory cell by using a spin-transfer torque current flowing through the selected memory cell through the selected bit line and the source line.

In example embodiments, the operations of changing data stored in the selected memory cell may include AP-to-P and P-to-AP writing operations performed in such a way that directions of the spin-transfer torque currents are anti-parallel to each other.

In example embodiments, the selected memory cell may include a magnetic tunnel junction including a free layer, a fixed layer, and a tunnel barrier therebetween. The magnetic memory device may further include a selected bit line and a source line connected to one or the free and fixed layers and the other, respectively. The data writing method may further include applying different voltages to the selected bit line and the source line to generate an ambient electric field between opposite terminals of the magnetic tunnel junction, when the ambient magnetic field is applied to the selected memory cell.

In example embodiments, the data writing method may include AP-to-P and P-to-AP writing operations changing data stored in the selected memory cell, and the ambient electric fields in the AP-to-P and P-to-AP writing operations may be generated to have substantially the same direction.

According to example embodiments of the inventive concept, a data writing method of a magnetic memory device may include flowing first and second currents, which are anti-parallel to each other, near left and right sides, respectively, of a selected magnetic tunnel junction to apply an ambient magnetic field to the selected magnetic tunnel junction. The ambient magnetic field may be generated to reduce a difference in magnitude between writing currents required for AP-to-P and P-to-AP writing operations.

In example embodiments, the selected magnetic tunnel junction may include a free layer, a fixed layer, and a tunnel barrier therebetween, and at least one of the free layer or the fixed layer may be configured to exhibit a perpendicular magnetization property.

In example embodiments, the magnetic memory device may further include a selected bit line connected to the selected magnetic tunnel junction, left bit lines provided at a left side of the selected bit line and parallel to the selected bit line, and right bit lines provided at a right side of the selected bit line and parallel to the selected bit line. The first current may be formed to flow through at least one of the left bit lines adjacent to the selected bit line, and the second current may be formed to flow-through at least one of the right bit lines adjacent to the selected bit line.

In example embodiments, the AP-to-P writing operation may be performed to apply the ambient magnetic field having a first magnitude and a first direction to the selected magnetic tunnel junction, and the P-to-AP writing operation may be performed to apply the ambient magnetic field having a second magnitude and a second direction to the selected magnetic tunnel junction. The first and second directions may be anti-parallel to each other.

In example embodiments, the first and second magnitudes may be substantially the same. In other example embodiments, the first and second magnitudes may be different from each other within a range capable of preventing data stored in the selected magnetic tunnel junction from being changed.

In example embodiments, one of the AP-to-P and P-to-AP writing operations may be performed to apply the ambient magnetic field having a finite magnitude to the selected magnetic tunnel junction, and the other may be performed without applying the ambient magnetic field to the selected magnetic tunnel junction.

In example embodiments, the magnetic memory device may further include a selected bit line and a source line that are connected to opposite terminals, respectively, of the selected magnetic tunnel junction, and at least one of the AP-to-P and P-to-AP writing operations may be performed using a spin-transfer torque current flowing through the selected magnetic tunnel junction through the selected bit line and the source line.

In example embodiments, the AP-to-P and P-to-AP writing operations may be performed in such a way that directions of the spin-transfer torque currents may be anti-parallel to each other.

According to example embodiments of the inventive concept, a data writing method of a magnetic memory device may include producing a potential difference between both terminals of a selected magnetic tunnel junction to apply an ambient electric field to the selected magnetic tunnel junction, and flowing first and second currents, which may be anti-parallel to each other, near left and right sides, respectively, of the selected magnetic tunnel junction to apply an ambient magnetic field to the selected magnetic tunnel junction.

In example embodiments, the selected magnetic tunnel junction may include a free layer, a fixed layer, and a tunnel barrier therebetween, and at least one of the free layer or the fixed layer may be configured to exhibit a perpendicular magnetization property.

In example embodiments, the magnetic memory device may further include a selected bit line connected to the selected magnetic tunnel junction, left bit lines provided at a left side of the selected bit line and parallel to the selected bit line, and right bit lines provided at a right side of the selected bit line and parallel to the selected bit line. The first current may be formed to flow through at least one of the left bit lines adjacent to the selected bit line, and the second current may be formed to flow through at least one of the right bit lines adjacent to the selected bit line.

In example embodiments, the data writing method may include AP-to-P and P-to-AP writing operations changing data stored in the selected magnetic tunnel junction, the AP-to-P writing operation may be performed to apply the ambient magnetic field having a first magnitude and a first direction to the selected magnetic tunnel junction, and the P-to-AP writing operation may be performed to apply the ambient magnetic field having a second magnitude and a second direction to the selected magnetic tunnel junction. The first and second directions may be anti-parallel to each other.

In example embodiments, the first and second magnitudes may be substantially the same. In other example embodiments, the first and second magnitudes may be different from each other within a range capable of preventing data stored in the selected magnetic tunnel junction from being changed.

In example embodiments, the data writing method may include AP-to-P and P-to-AP writing operations changing data stored in the selected magnetic tunnel junction, one of the AP-to-P and P-to-AP writing operations may be performed to apply the ambient magnetic field having a finite magnitude to the selected magnetic tunnel junction, and the other may be performed without applying the ambient magnetic field to the selected magnetic tunnel junction.

In example embodiments, the data writing method may include AP-to-P and P-to-AP writing operations changing data stored in the selected magnetic tunnel junction, and the ambient electric fields in the AP-to-P and P-to-AP writing operations may be generated to have substantially the same direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 11 through 14 are tables schematically illustrating methods of data writing operations according to exemplary embodiments of the inventive concept.

FIGS. 17 through 19 are tables schematically illustrating methods of data writing operations according to other exemplary embodiments of the inventive concept.

FIGS. 22 through 24 are tables schematically illustrating methods of data writing operations according to still other exemplary embodiments of the inventive concept.

FIGS. 25 through 27 are tables schematically illustrating methods of data writing operations according to even other exemplary embodiments of the inventive concept.

Figure 1:
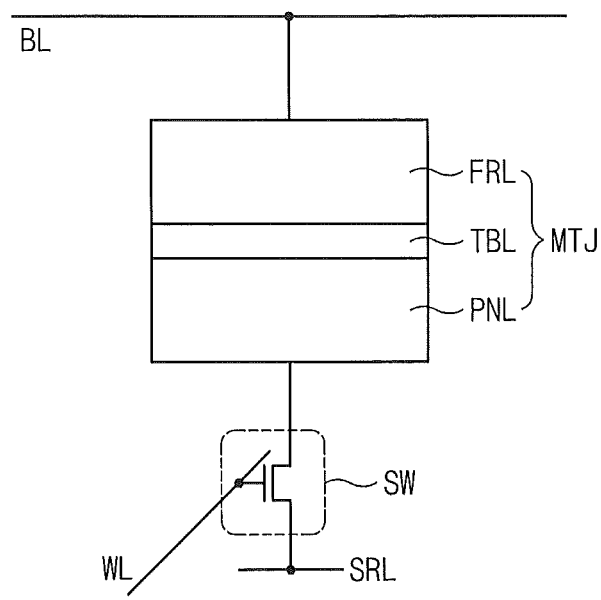
FIG. 1 is a circuit diagram illustrating a unit memory cell of a magnetic memory device according to exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout the description. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

FIG. 1 is a circuit diagram illustrating a unit memory cell of a magnetic memory device according to exemplary embodiments of the inventive concept.

Referring to FIG. 1, a unit memory cell UMC may include a selection device SW and a magnetic tunnel junction MTJ. The magnetic tunnel junction MTJ may include a pair of magnetic layers and a tunnel barrier layer TBL interposed therebetween. The pair of the magnetic layers may include a free layer FRL exhibiting a switchable magnetization property and a fixed layer PNL exhibiting a fixed magnetization property.

One (for example, the free layer FRL) of the pair of magnetic layers may be connected to a bit line BL, and the other is connected to a source line SRL via the selection device SW. The selection device SW may be connected in series between the magnetic tunnel junction MTJ and the source line SRL to control a flow of electrical charges passing through the magnetic tunnel junction MTJ. In certain embodiments, unlike that shown in FIG. 1, a structure of the magnetic tunnel junction MTJ may be changed in such a way that the fixed layer PNL may be positioned between the free layer FRL and the bit line BL.

The magnetic tunnel junction MTJ may have an electric resistance that is dependent on magnetization directions of the free and fixed layers FRL and PNL. For example, the electric resistance of the magnetic tunnel junction MTJ may be much higher when the magnetization directions of the free and fixed layers FRL and PNL are antiparallel than when they are parallel. This means that the electric resistance of the magnetic tunnel junction MTJ can be controlled by changing the magnetization direction of the free layer FRL. According to example embodiments of the inventive concept, this may be used as a data-storing mechanism for the magnetic memory device.

An operation of changing data stored in the magnetic tunnel junction MTJ (hereinafter, referred to as a 'writing operation') may include a) a P-to-AP writing operation, in which the magnetization direction of the free layer FRL is changed from a state (hereinafter, referred to as a 'P state') parallel to that of the fixed layer PNL to another state (hereinafter, referred to as an 'AP state') antiparallel to that of the fixed layer PNL, and b) an AP-to-P writing operation, in which the magnetization direction of the free layer FRL is changed from the AP state to the P state. Here, the magnetic tunnel junction MTJ may have low and high resistances, when it is in the P and AP states, respectively.

Figure 2:
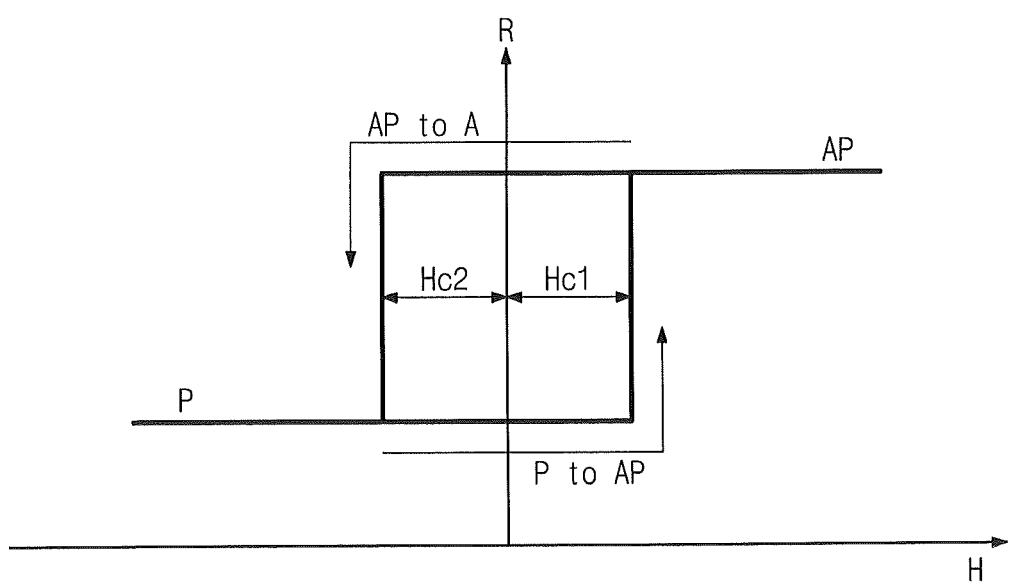
FIG. 2 is a graph showing an ideal magnetization switching behavior of a magnetic tunnel junction.

In the magnetic memory device, the P-to-AP and AP-to-P writing operations may be performed using an electrical signal (current or voltage) applied thereto through the bit line BL, and as shown in FIG. 2, such a change in electric resistance or data state of the magnetic tunnel junction MTJ can be understood by discussing a magnetization switching behavior or a resistance behavior of the magnetic tunnel junction MTJ resulting from an externally-applied magnetic field.

FIG. 2 is a graph showing an ideal magnetization switching behavior of a magnetic tunnel junction.

As illustrated by the arrow 'P to AP' of FIG. 2, by applying a critical magnetic field (hereinafter, referred to as a "first critical magnetic field Hc1") to the magnetic tunnel junction MTJ, it is possible to change the magnetic tunnel junction MTJ from the P state to the AP state. In addition, as illustrated by the arrow 'AP to P' of FIG. 2, by applying another critical magnetic field (hereinafter, referred to as a "second critical magnetic field Hc2") to the magnetic tunnel junction MTJ, it is possible to change the magnetic tunnel junction MTJ from the AP state to the P state.

In the case of an ideal magnetic tunnel junction MTJ (for example, having a sufficiently large size), the first and second critical magnetic fields Hc1 and Hc2 may have substantially the same magnitude. This means that the P-to-AP and AP-to-P writing operations can be performed using the first and second critical magnetic fields Hc1 and Hc2 having substantially the same magnitude, and magnitudes of electrical signals applied to the magnetic tunnel junction MTJ through the bit line BL can be substantially the same. In other words, the P-to-AP and AP-to-P writing operations can be performed using substantially the same energy.

Figure 3:
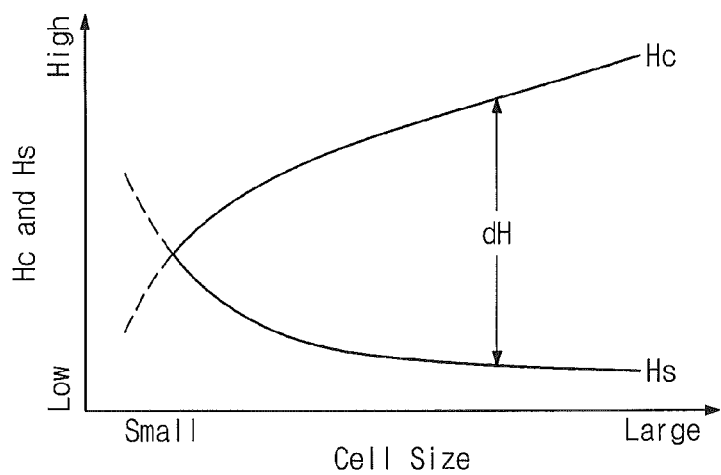
FIG. 3 is a graph schematically illustrating how critical and stray magnetic fields in a writing operation vary depending on a change in size of a magnetic tunnel junction.
Figure 4:
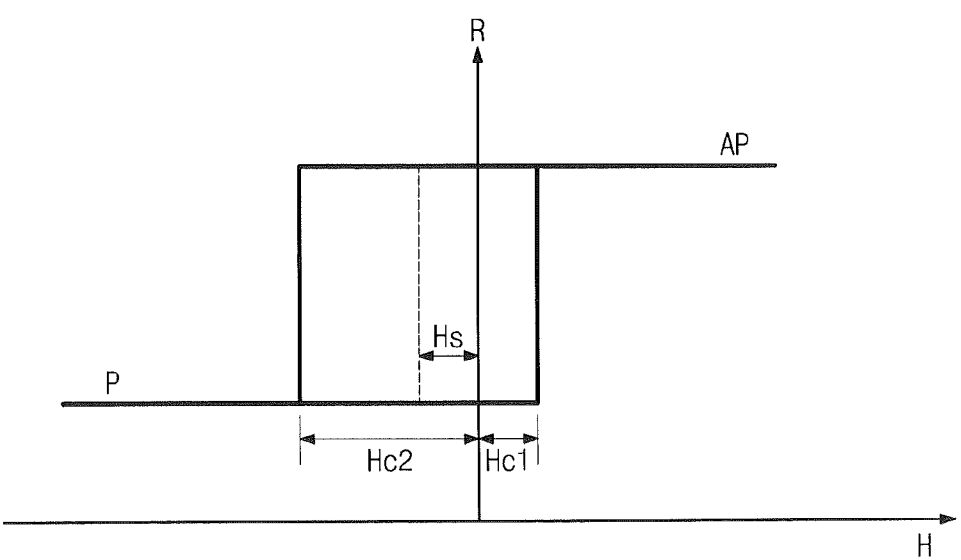
FIG. 4 is a graph showing an actual magnetization switching behavior of a magnetic tunnel junction.

FIG. 3 is a graph schematically illustrating how critical and stray magnetic fields in a writing operation vary depending on a change in size of a magnetic tunnel junction. FIG. 4 is a graph showing an actual magnetization switching behavior of a magnetic tunnel junction.

Referring to FIG. 3, with increasing integration density of a memory semiconductor device, a dimension of the magnetic tunnel junction MTJ decreases. As the result of the decrease in dimension of the magnetic tunnel junction MTJ, a critical magnetic field Hc in a writing operation can be reduced, and thus, it is possible to reduce energy consumption in the writing operation.

However, with decreasing dimension of the magnetic tunnel junction MTJ, it is more and more difficult to compensate for a stray field from the fixed layer PNL. For example, as shown in FIG. 3, the stray magnetic field Hs may increase with decreasing dimension of the magnetic tunnel junction MTJ. Furthermore, when a size of the magnetic tunnel junction MTJ becomes smaller than a specific size, magnitudes of the critical and stray magnetic fields Hc and Hs may be turned over. For example, if the size of the magnetic tunnel junction MTJ is smaller than the specific cell size, the stray magnetic field Hs may be larger than the critical magnetic field Hc (i.e., dH=Hc−Hs<0).

In other words, for practical cases, with decreasing dimension of the magnetic tunnel junction MTJ, the magnetization switching behavior of the magnetic tunnel junction MTJ may differ from that of FIG. 2; for example, as shown in FIG. 4, the first and second critical magnetic fields Hc1 and Hc2 may become different from each other. Although the first critical magnetic field Hc1 is illustrated to be smaller than the second critical magnetic field Hc2, in FIG. 4, the opposite may be true.

In the meantime, the increase of the stray magnetic field Hs may result in several technical difficulties. For example, the increase of the stray magnetic field Hs means that one of the P-to-AP and AP-to-P writing operations may require a large amount of energy, compared with the other. For example, in the case that the magnetic tunnel junction MTJ has a hysteresis loop shown in FIG. 4, energy consumption may be much greater for the AP-to-P writing operation than for the P-to-AP writing operation.

Figure 5:
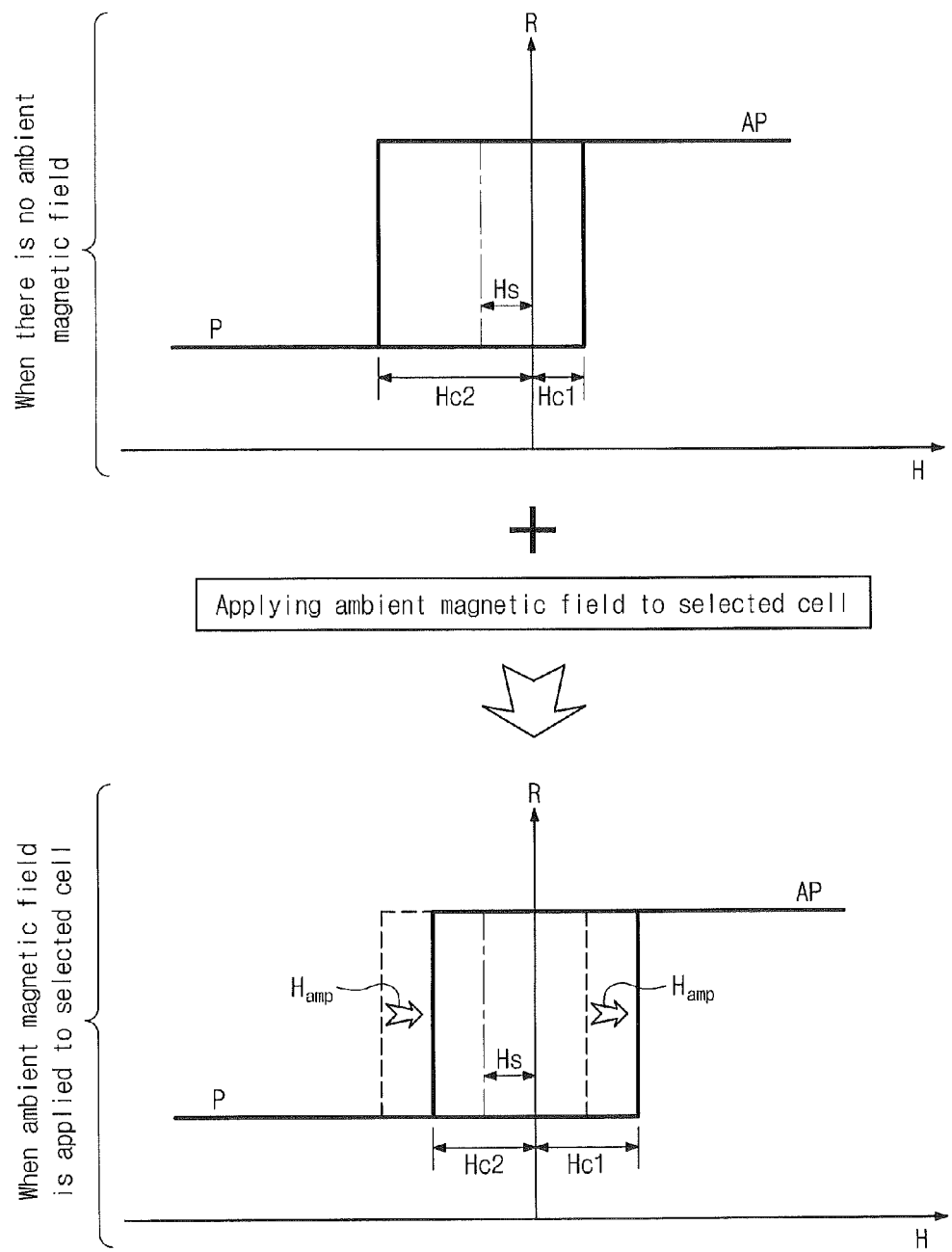
FIG. 5 is a diagram schematically illustrating a method of changing an inherent magnetization switching behavior of a magnetic tunnel junction using an ambient magnetic field, according to exemplary embodiments of the inventive concept.

FIG. 5 is a diagram schematically illustrating a method of changing an inherent magnetization switching behavior of a magnetic tunnel junction using an ambient magnetic field, according to exemplary embodiments of the inventive concept.

Referring to FIG. 5, in the case where an ambient magnetic field according to example embodiments of the inventive concept is not used, the magnetic tunnel junction MTJ may exhibit a magnetization switching behavior resembling that of FIG. 4, rather than that of FIG. 2. However, if the ambient magnetic field $H_{amb}$ according to example embodiments of the inventive concept is applied, the magnetic tunnel junction MTJ may have a resistance hysteresis loop that is horizontally shifted along a magnetic field axis. For example, by applying the ambient magnetic field $H_{amb}$, it is possible to change the magnetization switching behavior of the magnetic tunnel junction MTJ from that of FIG. 4 to that of FIG. 2. In other words, the applying of the ambient magnetic field may change the magnetization switching behavior of the magnetic tunnel junction MTJ, in such a way that the first and second critical magnetic fields Hc1 and Hc2 can have the same magnitude. For example, the ambient magnetic field $H_{amb}$ may be generated to have the same magnitude as and the opposite direction to the stray magnetic field Hs. As a result, the AP-to-P and P-to-AP writing operations may be performed to consume substantially the same amount of energy.

Figure 6:
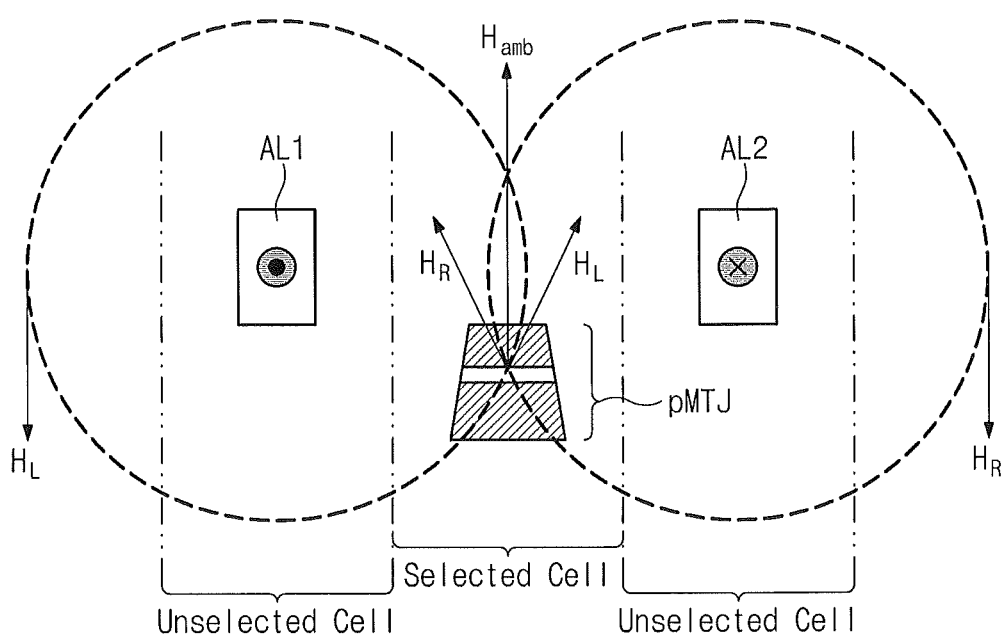
FIG. 6 is a schematic diagram illustrating operations for generating the ambient magnetic field, according to exemplary embodiments of the inventive concept.

FIG. 6 is a schematic diagram illustrating a way of generating the ambient magnetic field, according to exemplary embodiments of the inventive concept.

Referring to FIG. 6, the generating of the ambient magnetic field $H_{amb}$ may include forming at least one pair of currents, flowing through at least one pair of ambient wiring lines AL1 and AL2, at both sides of a selected cell. The at least one pair of ambient wiring lines AL1 and AL2 may constitute or be connected to at least one pair of non-selected cells, which may be disposed adjacent to the selected cell.

According to Ampere's law, as shown in FIG. 6, the currents may produce first and second ambient magnetic fields $H_L$ and $H_R$ around the ambient wiring lines AL1 and AL2. In the case where distances between the pair of ambient wiring lines AL1 and AL2 and the magnetic tunnel junction MTJ of the selected cell are the same, the pair of currents may have substantially the same magnitude and be formed to flow along directions that are anti-parallel to each other. In this case, at the selected magnetic tunnel junction MTJ, the first and second ambient magnetic fields $H_L$ and $H_R$ may have the same magnitude as each other and an inner product thereof may be positive. Accordingly, a vector sum of the first and second ambient magnetic fields $H_L$ and $H_R$ (i.e., the ambient magnetic field $H_{amb}$) may be perpendicular to a top surface of the selected magnetic tunnel junction MTJ and have a magnitude that is larger than that of each of the first and second ambient magnetic fields $H_L$ and $H_R$. Because the direction of the ambient magnetic field $H_{amb}$ is perpendicular to the top surface of the magnetic tunnel junction MTJ, for the magnetic tunnel junction MTJ of perpendicular type, it is possible to reduce a difference between the first and second critical magnetic fields Hc1 and Hc2, as shown in FIG. 5.

Figure 15:
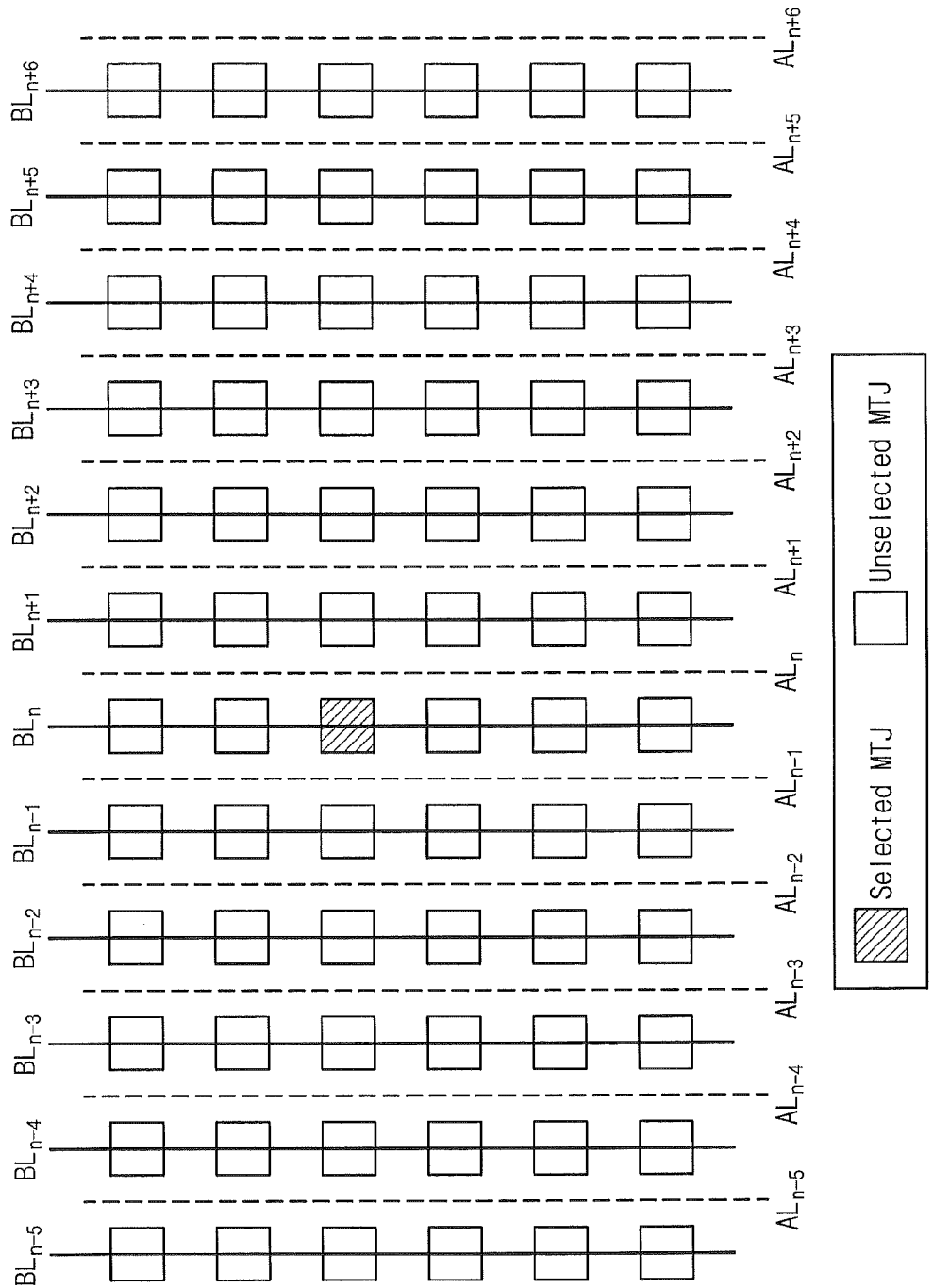
FIG. 15 is a diagram schematically illustrating a portion of a memory cell array, according to other exemplary embodiments of the inventive concept.

In example embodiments, the ambient wiring lines AU and AL2 may serve as non-selected bit lines connected to the non-selected cells, as shown in FIG. 7 and FIGS. 10 through 14. In other example embodiments, the ambient wiring lines AU and AL2 may be additionally provided between the bit lines, as shown in FIG. 15.

Figure 7:
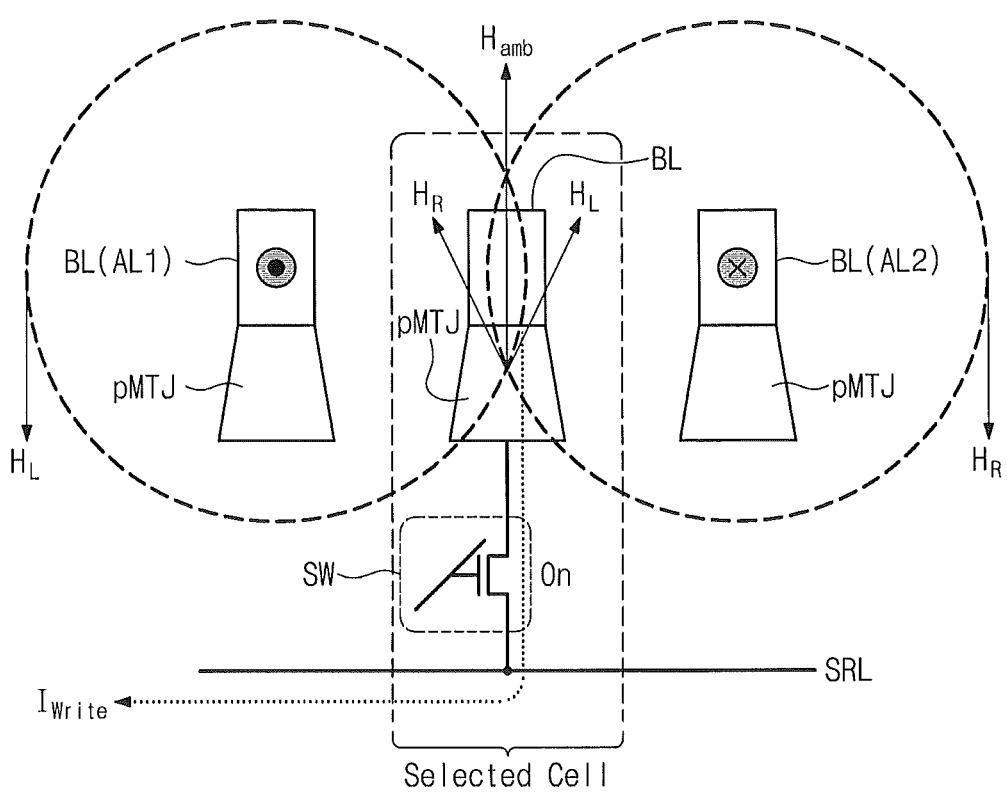
FIG. 7 is a schematic diagram illustrating an example of a data writing operation, for which the ambient magnetic field is used, according to exemplary embodiments of the inventive concept.

FIG. 7 is a schematic diagram illustrating an example of a data writing operation, for which the ambient magnetic field is used, according to exemplary embodiments of the inventive concept.

Referring to FIG. 7, a data writing operation according to the present embodiment may include applying the ambient magnetic field $H_{amb}$ to the selected magnetic tunnel junction MTJ and forming a writing current $I_{write}$ passing through the selected magnetic tunnel junction MTJ. The ambient magnetic field $H_{amb}$ may be generated by the method described with reference to FIG. 6. In the present embodiment, as shown in FIG. 7, bit lines coupled to the non-selected cells may be used as the ambient wiring lines AL1 and AL2. The writing current $I_{write}$ may be produced by applying different voltages to the bit line BL and the source line SRL coupled to the selected magnetic tunnel junction MTJ and turning on the selection device SW coupled to the selected magnetic tunnel junction MTJ. A magnetization direction of the free layer FRL of the selected magnetic tunnel junction MTJ may be changed through a spin-transfer torque process of electrons constituting the writing current $I_{write}$.

As described with reference to FIG. 5, the ambient magnetic field $H_{amb}$ may change a magnetization switching behavior of the magnetic tunnel junction MTJ, in which the first and second critical magnetic fields Hc1 and Hc2 become substantially equal to each other. However, in other example embodiments, as will be described with reference to FIGS. 8 and 9, the ambient magnetic field $H_{amb}$ may be used to reduce a magnitude of at least one of the first and second critical magnetic fields Hc1 and Hc2.

Figure 8:
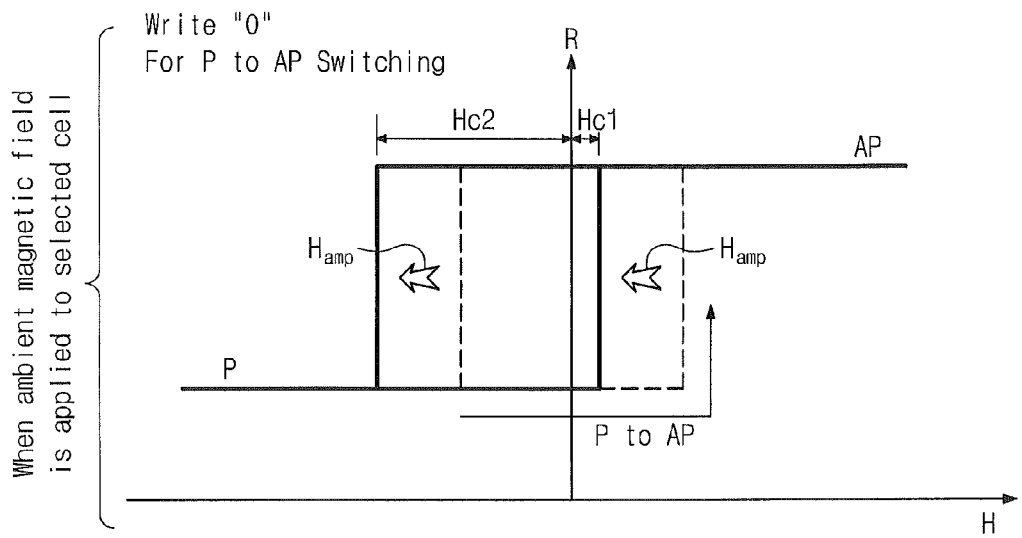
FIG. 8 is a graphical diagram illustrating a P-to-AP writing operation, for which the ambient magnetic field is used, according to exemplary embodiments of the inventive concept.
Figure 9:
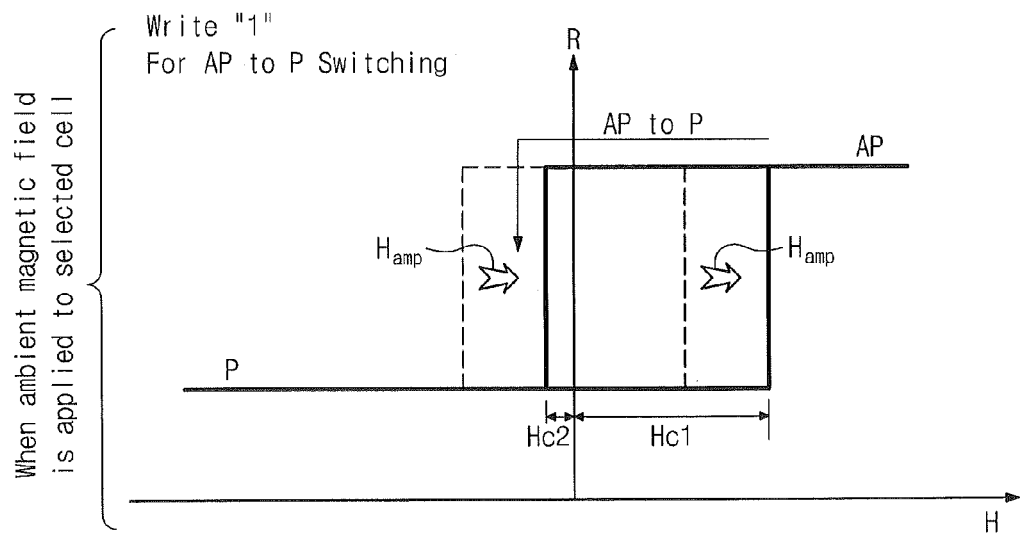
FIG. 9 is a graphical diagram illustrating an AP-to-P writing operation, for which the ambient magnetic field is used, according to exemplary embodiments of the inventive concept.

FIG. 8 is a graphical diagram illustrating a P-to-AP writing operation, for which the ambient magnetic field is used, according to exemplary embodiments of the inventive concept, and FIG. 9 is a graphical diagram illustrating an AP-to-P writing operation, for which the ambient magnetic field is used, according to exemplary embodiments of the inventive concept.

Referring to FIG. 8, the P-to-AP writing operation may include applying the ambient magnetic field $H_{amb}$ to the selected magnetic tunnel junction MTJ in such a way that the first critical magnetic field Hc1 becomes smaller than the second critical magnetic field Hc2. For example, the ambient magnetic field $H_{amb}$ may be generated in such a way that the first critical magnetic field Hc1 has a magnitude ranging from about 1/20 to about 1/2 times a magnitude of the second critical magnetic field Hc2. Accordingly, it is possible to decrease the writing current $I_{write}$ for the P-to-AP writing operation, compared with the case that the ambient magnetic field $H_{amb}$ is not applied to the selected magnetic tunnel junction MTJ.

Referring to FIG. 9, the AP-to-P writing operation may include applying the ambient magnetic field $H_{amb}$ to the selected magnetic tunnel junction MTJ in such a way that the second critical magnetic field Hc2 becomes smaller than the first critical magnetic field Hc1. For example, the ambient magnetic field $H_{amb}$ may be generated in such a way that the second critical magnetic field Hc2 has a magnitude ranging from about 1/20 to about 1/2 times a magnitude of the first critical magnetic field Hc1. Accordingly, it is possible to decrease the writing current $I_{write}$ for the AP-to-P writing operation, compared with the case that the ambient magnetic field $H_{amb}$ is not applied to the selected magnetic tunnel junction MTJ.

Meanwhile, the magnitude of the ambient magnetic field $H_{amb}$ in the P-to-AP writing operation may be different from that in the AP-to-P writing operation. For example, in the case where, when the ambient magnetic field $H_{amb}$ is not applied, the selected magnetic tunnel junction MTJ exhibits the magnetization switching behavior of FIG. 4, a required magnitude of the ambient magnetic field $H_{amb}$ may be smaller in the P-to-AP writing operation than in the AP-to-P writing operation. In both of the P-to-AP and AP-to-P writing operations, the ambient magnetic field $H_{amb}$ may be applied to have a magnitude preventing data stored in the selected magnetic tunnel junction MTJ from being changed.

The writing current $I_{write}$ in the P-to-AP writing operation may be different from that in the AP-to-P writing operation. For example, the writing current $I_{write}$ in the P-to-AP writing operation may be formed to flow along a direction opposite or antiparallel to that in the AP-to-P writing operation. In other words, if the writing current $I_{write}$ in the P-to-AP writing operation flows from the bit line BL to the source line SRL, the writing current $I_{write}$ in the AP-to-P writing operation may flow from the source line SRL to the bit line BL. Furthermore, In example embodiments, even when the ambient magnetic field $H_{amb}$ is applied, if the second-critical magnetic field Hc2 is different from the first critical magnetic field Hc1, a magnitude of the writing current $I_{write}$ in the P-to-AP writing operation may differ from that in the AP-to-P writing operation.

Figure 10:
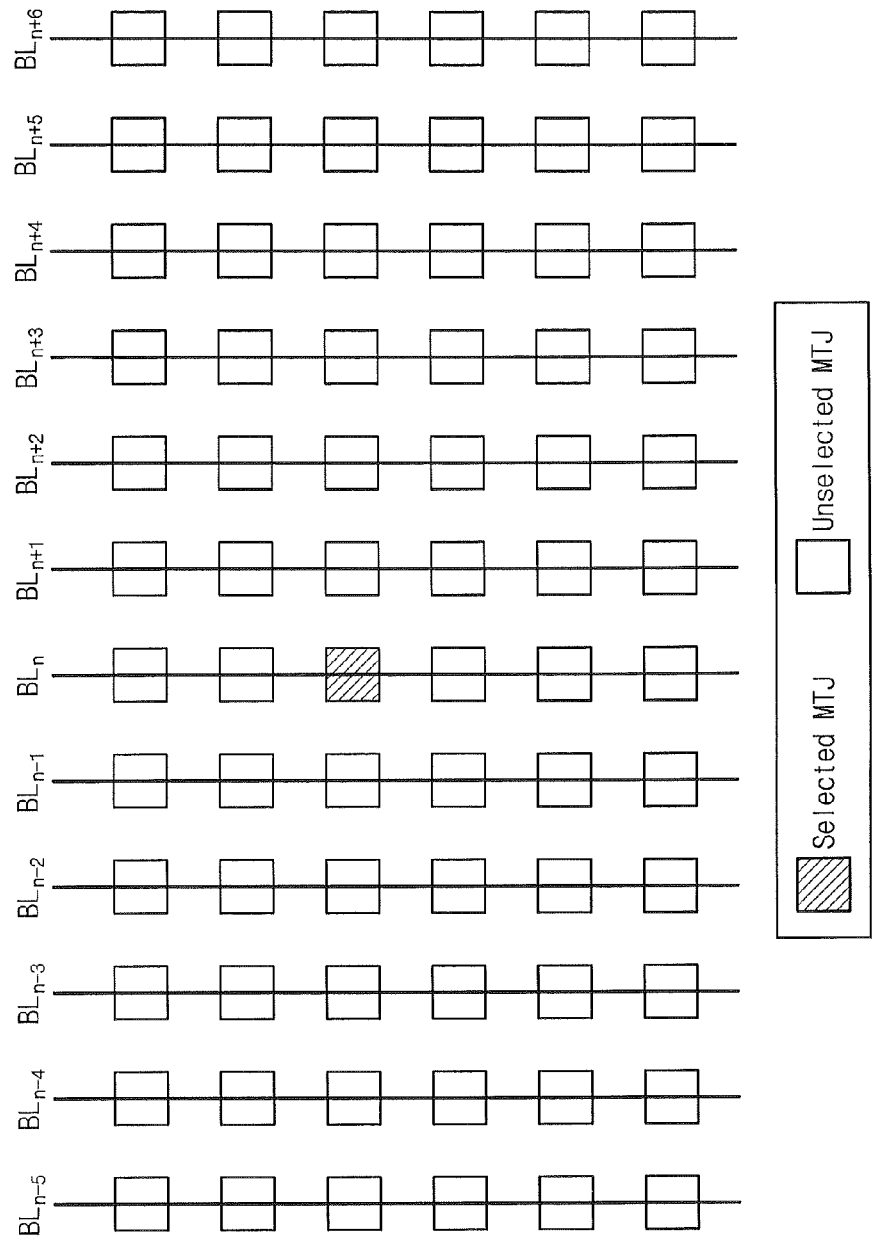
FIG. 10 is a diagram schematically illustrating a portion of a memory cell array, according to exemplary embodiments of the inventive concept.

The way of generating the ambient magnetic field $H_{amb}$ may be variously modified in consideration of purpose and method of the writing operation, which will be performed using the ambient magnetic field $H_{amb}$, as will be described with reference to FIGS. 10 through 19. FIG. 10 is a diagram schematically illustrating a portion of a memory cell array, according to exemplary embodiments of the inventive concept, and FIGS. 11 through 14 are tables schematically illustrating methods of data writing operations according to exemplary embodiments of the inventive concept.

Hereinafter, some examples of possible ways of generating the ambient magnetic field $H_{amb}$ in the cell array structure of FIG. 10 will be described with reference to FIGS. 11 through 14. However, the illustrations of FIGS. 10 through 14 are to provide better understanding of example embodiments of the inventive concept, but example embodiments of the inventive concepts may not be limited thereto.

As shown in FIG. 10, in a magnetic memory device according to example embodiments of the inventive concept, a cell array may include two-dimensionally arranged magnetic tunnel junctions MTJ and a plurality of bit lines $BL_{n-5}$, $BL_{n-4}$, ..., $BL_n$, ..., $BL_{n+5}$, $BL_{n+6}$ connecting the magnetic tunnel junctions MTJ to each other. The bit lines $BL_{n-5}$, $BL_{n-4}$, ..., $BL_n$, ... $BL_{n+5}$, $BL_{n+6}$ may be arranged parallel to each other, and each of them may be connected in common to plural ones of the magnetic tunnel junctions MTJ arranged parallel thereto.

Each of the methods illustrated in FIGS. 11 through 14 may be used for a writing operation, which will be performed to one of the magnetic tunnel junctions MTJ (hereinafter, referred to as "selected magnetic tunnel junction") connected to one, e.g., $BL_n$, of the bit lines (hereinafter, referred to as "selected bit line"). The P-to-AP and AP-to-P writing operations, which may be performed using the writing currents $I_{write}$ having the same magnitude or the same current density, will be exemplarily described below. However, to suit a developer's requirements (for example, in the case that the second critical magnetic field Hc2 is different from the first critical magnetic field Hc1, as described above), the writing current $I_{write}$ in the P-to-AP writing operation may be configured to be different from the writing current, $-I_{write}$, in the AP-to-P writing operation, in terms of magnitude or current density. It is possible for the skilled person in the art to realize such modifications based on the disclosure of the present application, and thus, for the sake of brevity, a detailed description thereof will be omitted.

As shown in FIGS. 11 and 12, the P-to-AP and AP-to-P writing operations may include applying ambient magnetic fields $H_{amb}$ and writing currents $I_{write}$ or $-I_{write}$ to the selected magnetic tunnel junction MTJ. During the P-to-AP and AP-to-P writing operations, the writing currents $I_{write}$ and $-I_{write}$ passing through the selected magnetic tunnel junction MTJ may have antiparallel directions. The ambient magnetic fields $H_{amb}$, which are applied to the selected magnetic tunnel junction MTJ during the P-to-AP and AP-to-P writing operations, may have substantially the same magnitude as each other and have anti-parallel directions to each other.

In each of the P-to-AP and AP-to-P writing operations, as shown in FIG. 11, the ambient magnetic fields $H_{amb}$ may be generated by currents passing through a pair of non-selected bit lines $BL_{n-1}$ and $BL_{n+1}$ adjacent to the selected bit line $BL_n$. By contrast, as shown in FIG. 12, the ambient magnetic fields $H_{amb}$ may be generated by currents passing through a plurality of pairs of non-selected bit lines $BL_{n-4}$, $BL_{n-3}$, $BL_{n-2}$, $BL_{n-1}$, $BL_{n+1}$, $BL_{n+2}$, $BL_{n+3}$, $BL_{n+4}$ adjacent to the selected bit line $BL_n$, and in this case, the ambient magnetic fields $H_{amb}$ may have an increased magnitude, compared with the case of FIG. 11.

In other example embodiments, the ambient magnetic fields $H_{amb}$, which are applied to the selected magnetic tunnel junction MTJ during the P-to-AP and AP-to-P writing operations, may have different magnitudes from each other. For example, as shown in FIG. 13, the P-to-AP writing operation may be performed to apply only the writing current $I_{write}$ to the selected magnetic tunnel junction MTJ, without applying the ambient magnetic field $H_{amb}$, while the AP-to-P writing operation may be performed to apply both of the ambient magnetic field $H_{amb}$ and the writing current $I_{write}$ to the selected magnetic tunnel junction MTJ. Alternatively, as shown in FIG. 14, a magnitude of the ambient magnetic field $H_{amb}$ applied to the selected magnetic tunnel junction MTJ may be larger in the AP-to-P writing operation than in the P-to-AP writing operation.

As previously described with reference to FIG. 4, in the case where the first critical magnetic field Hc1 is smaller than the second critical magnetic field Hc2, by using the writing methods of FIGS. 13 and 14, it is possible to remove or decrease a difference between the writing currents, $I_{write}$ or for the P-to-AP and AP-to-P writing operations. Such an asymmetric generation of the ambient magnetic field $H_{amb}$ may be adaptively applied in consideration of the difference between the first and second critical magnetic fields Hc1 and Hc2, and example embodiments of the inventive concept may not be limited to the examples described with reference to FIGS. 13 and 14. For example, in the case where the second critical magnetic field Hc2 is smaller than the first critical magnetic field Hc1, a magnitude of the ambient magnetic field $H_{amb}$ may be larger in the P-to-AP writing operation than in the AP-to-P writing operation.

Figure 16:
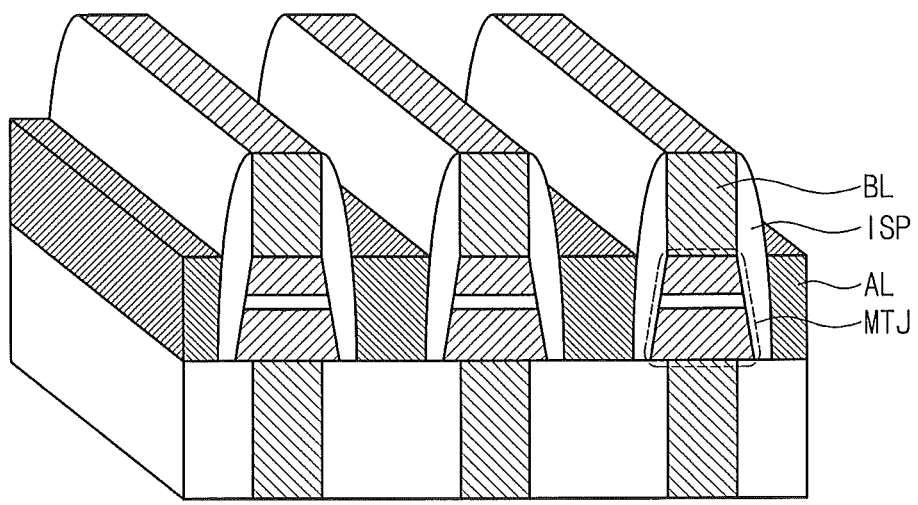
FIG. 16 is a sectional view illustrating a portion of a memory cell array, according to other exemplary embodiments of the inventive concept.

FIG. 15 is a diagram schematically illustrating a portion of a memory cell array, according to other exemplary embodiments of the inventive concept, and FIG. 16 is a sectional view illustrating a portion of a memory cell array, according to other exemplary embodiments of the inventive concept. FIGS. 17 through 19 are tables schematically illustrating methods of data writing operations according to other exemplary embodiments of the inventive concept.

Hereinafter, some examples of possible ways of generating the ambient magnetic field $H_{amb}$ in the cell array structure of FIG. 15 will be described with reference to FIGS. 17 through 19. However, FIGS. 15 through 19 illustrate example embodiments of the inventive concept, but example embodiments of the inventive concepts may not be limited thereto.

Referring to FIG. 15, when compared with the structure of FIG. 10, the cell array of the magnetic memory device may further include ambient wiring lines AL (e.g., $AL_{n-5}$, $AL_{n-4}$, ..., $AL_{n-1}$, $AL_{n+1}$, ..., $AL_{n+5}$, $AL_{n+6}$) disposed between the bit lines BL (e.g., $BL_{n-5}$, $BL_{n-4}$, ..., $BL_n$, ..., $BL_{n+5}$, $BL_{n+6}$). As shown in FIG. 16, the ambient wiring lines AL may be provided between the bit lines BL and be electrically separated from the bit lines BL by insulating spacers ISP. Furthermore, the ambient wiring lines AL may be electrically isolated from other conductive elements constituting the magnetic tunnel junction MTJ or a memory cell.

Each of the operations illustrated in FIGS. 17 through 19 may be used for a writing operation, which will be performed to a selected magnetic tunnel junction MTJ disposed in the cell array of FIG. 15, Like the previous embodiments, the P-to-AP and AP-to-P writing operations, which may be performed using the writing currents $I_{write}$ having the same magnitude or the same current density, will be exemplarily described below.

As shown in FIGS. 17 through 19, the P-to-AP and AP-to-P writing operations may include the ambient magnetic fields $H_{amb}$ and the writing currents $I_{write}$ or $-I_{write}$ to the selected magnetic tunnel junction MTJ. During the P-to-AP and AP-to-P writing operations, the writing currents $I_{write}$ and $-I_{write}$ passing through the selected magnetic tunnel junction MTJ may have antiparallel directions to each other. The ambient magnetic fields $H_{amb}$, which are applied to the selected magnetic tunnel junction MTJ during the P-to-AP and AP-to-P writing operations, may have substantially the same magnitude as each other and have anti-parallel directions to each other.

In each of the P-to-AP and AP-to-P writing operations, as shown in FIG. 17, the ambient magnetic fields $H_{amb}$ may be generated by currents passing through a pair of ambient wiring lines $AL_{n-1}$ and $AL_{n+1}$ adjacent to the selected bit line $BL_n$. By contrast, as shown in FIG. 18, the ambient magnetic fields $H_{amb}$ may be generated by currents passing through a plurality of pairs of ambient wiring lines $AL_{n-2}$, $AL_{n-1}$, $AL_{n+1}$, $AL_{n+2}$ adjacent to the selected bit line $BL_n$. Alternatively, as shown in FIG. 19, the ambient magnetic fields $H_{amb}$ may be generated by currents passing through at least one pair of the bit lines (for example, $BL_{n-1}$ and $BL_{n+1}$) and at least one pair of the ambient wiring lines (e.g., $AL_{n-2}$, $AL_{n-1}$, $AL_{n+1}$, $AL_{n+2}$) adjacent to the selected bit line $BL_n$.

In other example embodiments, the ambient magnetic fields $H_{amb}$, which are applied to the selected magnetic tunnel junction MTJ during the P-to-AP and AP-to-P writing operations, may have different magnitudes from each other. For example, the ambient magnetic fields $H_{arm}$ may be asymmetrically generated in consideration of a difference between the first and second critical magnetic fields Hc1 and Hc2. Such an asymmetric generation of the ambient magnetic field $H_{amb}$ may be realized by the methods described with reference to FIGS. 13 and 14, and thus, for the sake of brevity, a detailed description thereof will be omitted.

Figure 20:
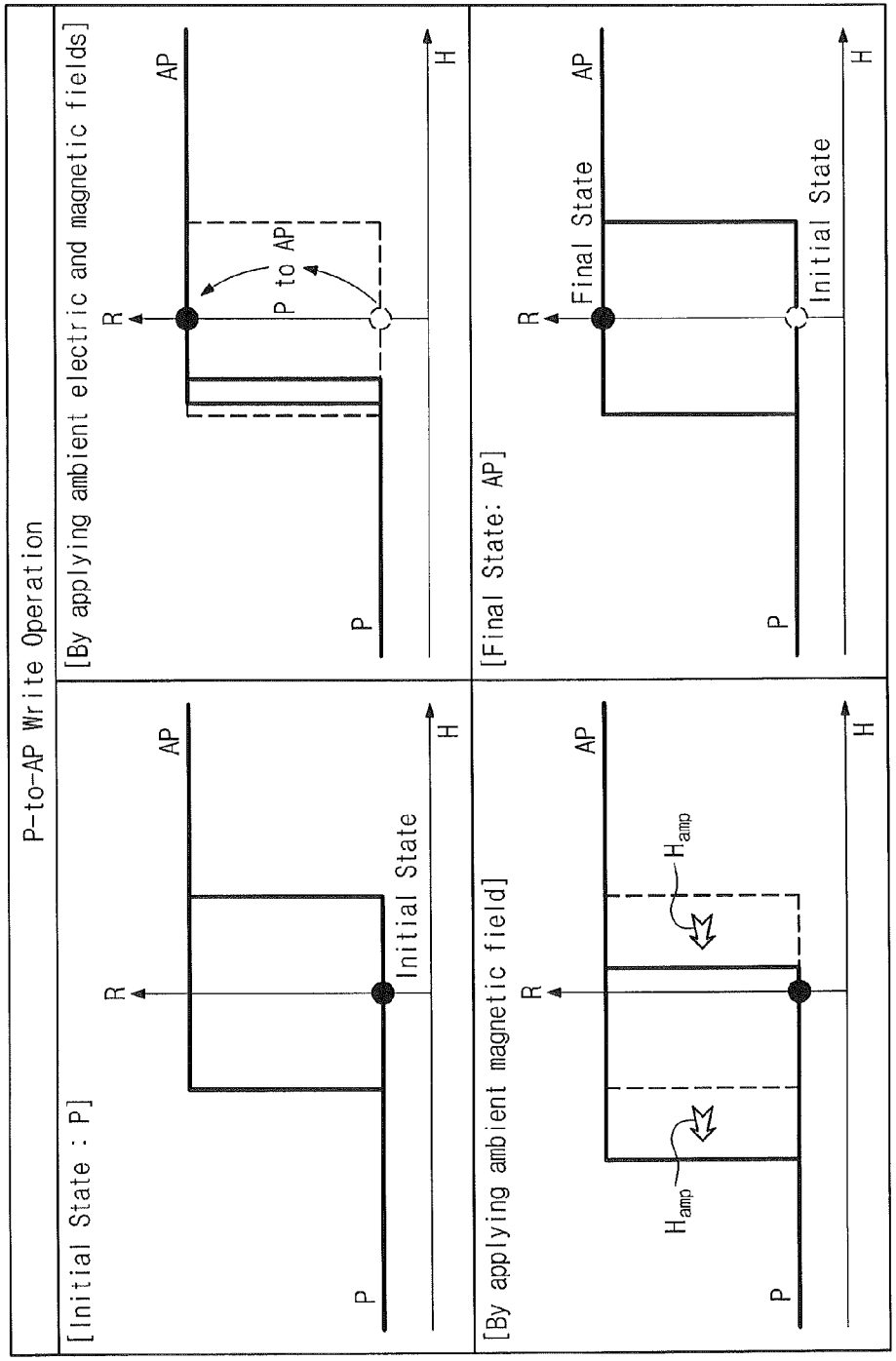
FIG. 20 is a diagram schematically illustrating a P-to-AP writing operation, for which an ambient magnetic field and an ambient electric field are used, according to exemplary embodiments of the inventive concept.
Figure 21:
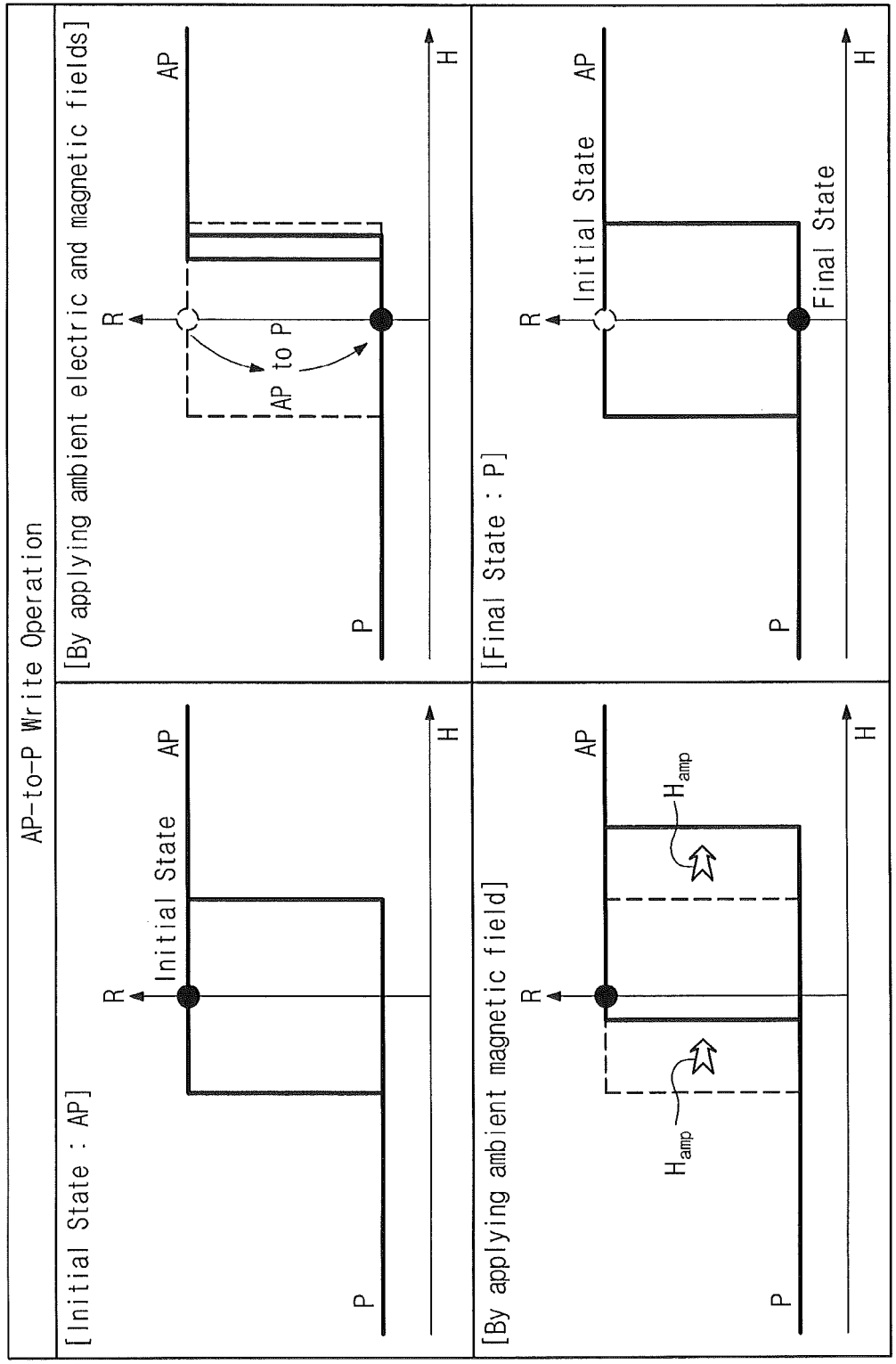
FIG. 21 is a diagram schematically illustrating an AP-to-P writing operation, for which an ambient magnetic field and an ambient electric field are used, according to exemplary embodiments of the inventive concept.

FIG. 20 is a diagram schematically illustrating a P-to-AP writing operation, for which an ambient magnetic field and an ambient electric field are used, according to exemplary embodiments of the inventive concept, and FIG. 21 is a diagram schematically illustrating an AP-to-P writing operation, for which an ambient magnetic field and an ambient electric field are used, according to exemplary embodiments of the inventive concept.

According to the present embodiments, during the P-to-AP and AP-to-P writing operations, not only the ambient magnetic field $H_{amb}$ but also an ambient electric field may be applied to the selected magnetic tunnel junction MTJ. The ambient magnetic field $H_{amb}$ may be generated using currents passing through at least one of the ambient wiring lines AL or the non-selected bit lines (e.g., $BL_{n-4}$, $BL_{n-3}$, $BL_{n-2}$, $BL_{n-1}$, $BL_{n+1}$, $BL_{n+2}$, $BL_{n+3}$, $BL_{n+4}$), and the ambient electric field may be generated using voltages applied to the bit line BL and the source line SRL. For example, the ambient magnetic field $H_{amb}$ may be generated by using or modifying the operations described with reference to FIGS. 6 through 19, while the ambient electric field may be generated by applying different voltages, which may be transmitted through the bit line BL and the source line SRL, selectively to both terminals of the selected magnetic tunnel junction MTJ using the selection device SW.

In example embodiments, similar to the previous embodiments described with reference to FIGS. 6 through 19, by applying the ambient magnetic field $H_{amb}$, a hysteresis loop of the magnetic tunnel junction may be shifted along a horizontal axis or a magnetic field axis. For example, as shown in FIGS. 20 and 21, by applying the ambient magnetic field $H_{amb}$ to the magnetic tunnel junction, the hysteresis loop of the magnetic tunnel junction may be leftward or rightward shifted along the magnetic field axis, compared with its initial state. In other words, in the case where the ambient magnetic field $H_{amb}$ is applied to the magnetic tunnel junction, the selected magnetic tunnel junction MTJ may be in a state close to the right or left side of the hysteresis loop. The shift direction of the hysteresis loop may be controlled by changing the direction of the ambient magnetic field $H_{amb}$.

The applying of the ambient electric field may lead to a change in width of the hysteresis loop of the selected magnetic tunnel junction MTJ. For example, by applying the ambient electric field, as shown in FIGS. 20 and 21, the hysteresis loop of the magnetic tunnel junction may have a reduced horizontal width, compared with the initial state or the case that the ambient magnetic field $H_{amb}$ is solely applied to the magnetic tunnel junction. Accordingly, in the case where the ambient electric field has a sufficiently high magnitude, an initial resistance state of the selected magnetic tunnel junction MTJ may depart from the hysteresis loop. For example, in the P-to-AP and AP-to-P writing operations, the ambient electric field may be configured to have a magnitude allowing an initial state of the selected magnetic tunnel junction MTJ to depart or deviate from the shifted hysteresis loop made by applying the ambient magnetic field $H_{amb}$.

The hysteresis loop refers to a set of allowed resistance states of the selected magnetic tunnel junction MTJ, and thus, in the case where the selected magnetic tunnel junction MTJ has a resistance state out of the hysteresis loop by applying the ambient electric field, the selected magnetic tunnel junction MTJ may have one of the allowed states given by the hysteresis loop. In other words, by applying the ambient electric field, the selected magnetic tunnel junction MTJ can be switched to a resistance state different from its initial resistance state. Thereafter, when the ambient electric field and the ambient magnetic field $H_{amb}$ are removed from the selected magnetic tunnel junction MTJ, the selected magnetic tunnel junction MTJ may be in a resistance state different from its initial resistance state.

According to one aspect of the present embodiment, the applying of the ambient magnetic field $H_{amb}$ may be an operation for selecting a switching direction (i.e., one of the AP-to-P and P-to-AP switchings), and the applying of the ambient electric field may be an operation for changing or switching data.

According to other aspects of the present embodiment, the applying of the ambient electric field may be an operation for reducing the external energy required to change data stored in the selected magnetic tunnel junction MTJ. For example, in the case where, without the applying of the ambient electric field, the ambient magnetic field $H_{amb}$ is only used for the data writing operation, to perform a switching operation effectively, it may be necessary to increase a magnitude of the ambient magnetic field $H_{amb}$.

FIGS. 22 through 27 are tables schematically illustrating methods of data writing operations according to still other exemplary embodiments of the inventive concept. The data writing operations illustrated in FIGS. 22 through 24 may be applied for the magnetic memory device including the cell array structure of FIG. 10, and the data writing operations illustrated in FIGS. 25 through 27 may be applied for the magnetic memory device including the cell array structure of FIG. 15.

As shown in FIGS. 22 through 27, the P-to-AP and AP-to-P writing operations may include the ambient magnetic field $H_{amb}$ and the ambient electric field $E_{amb}$ to the selected magnetic tunnel junction MTJ. During the P-to-AP and AP-to-P writing operations, the ambient electric field $E_{amb}$ having the same direction and the same magnitude may be applied to the selected magnetic tunnel junction MTJ, but example embodiments of the inventive concepts may not be limited thereto. For example, the ambient electric field $E_{amb}$ in the P-to-AP writing operation may have an opposite direction or different magnitude, compared with that of the AP-to-P writing operation, unlike that illustrated in FIGS. 22 through 27.

During the P-to-AP and AP-to-P writing operations, the ambient magnetic fields $H_{amb}$ applied to the selected magnetic tunnel junction MTJ may have substantially the same magnitude and anti-parallel directions to each other, as shown in FIGS. 22, 23, 25 through 27, or have different magnitudes and anti-parallel directions to each other, as shown in FIG. 24. Furthermore, the ambient magnetic fields $H_{amb}$ may be applied to the selected magnetic tunnel junction MTJ in the same manner as some of the previous embodiments described with reference to FIGS. 6 through 19, and for the sake of brevity, a detailed description thereto will be omitted.

Figure 28:
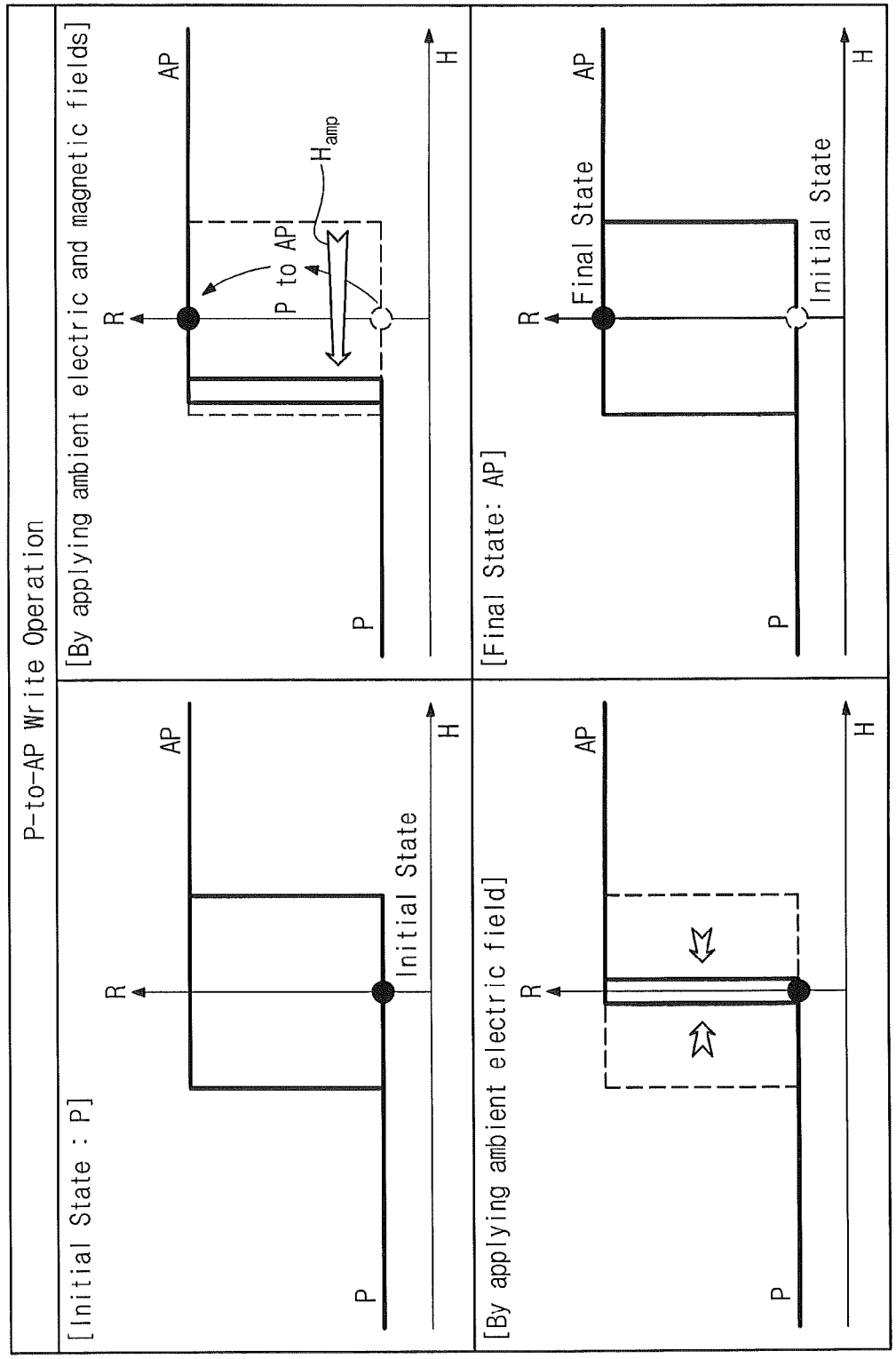
FIG. 28 is a diagram schematically illustrating a P-to-AP writing operation, for which an ambient magnetic field and an ambient electric field are used, according to other exemplary embodiments of the inventive concept.

As shown in FIGS. 20 and 21, the P-to-AP and AP-to-P writing operations may be performed to apply the ambient magnetic field $H_{amb}$ and the ambient electric field $E_{amb}$ sequentially to the selected magnetic tunnel junction MTJ. However, in other example embodiments, the P-to-AP writing operation may be performed to apply the ambient electric field $E_{amb}$ and the ambient magnetic field $H_{amb}$ sequentially to the selected magnetic tunnel junction MTJ, as shown in FIG. 28. Although not illustrated, the AP-to-P writing operation may also be performed to apply the ambient electric field $E_{amb}$ and the ambient magnetic field $H_{amb}$ sequentially to the selected magnetic tunnel junction MTJ, similar to the case of FIG. 28. In still other example embodiments, the P-to-AP and AP-to-P writing operations may be performed to apply the ambient magnetic field $H_{amb}$ and the ambient electric field $E_{amb}$, at substantially the same time, to the selected magnetic tunnel junction MTJ.

Figure 29:
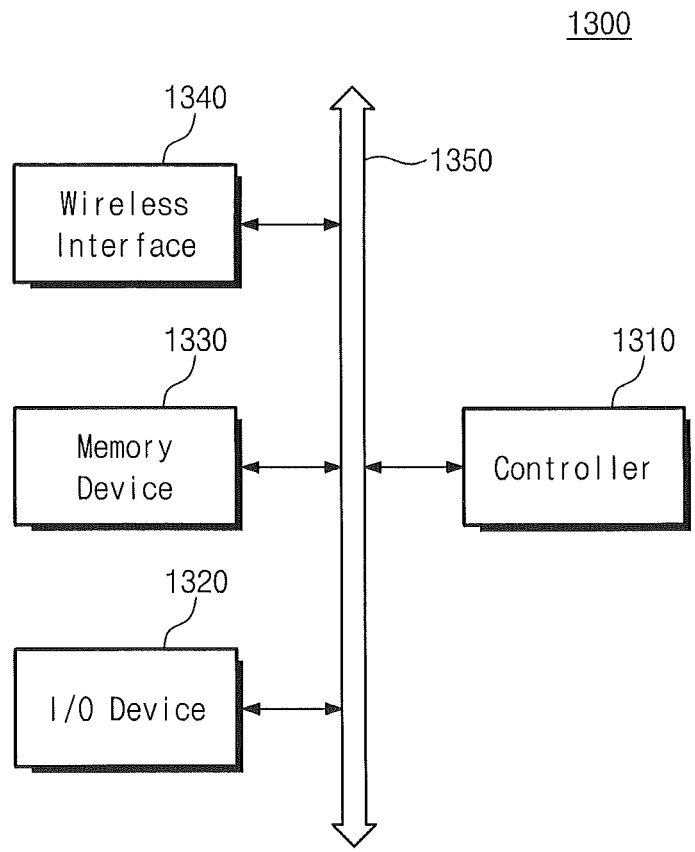
FIGS. 29 and 30 are block diagrams schematically illustrating electronic devices including a semiconductor device according to example embodiments of the inventive concept.
Figure 30:
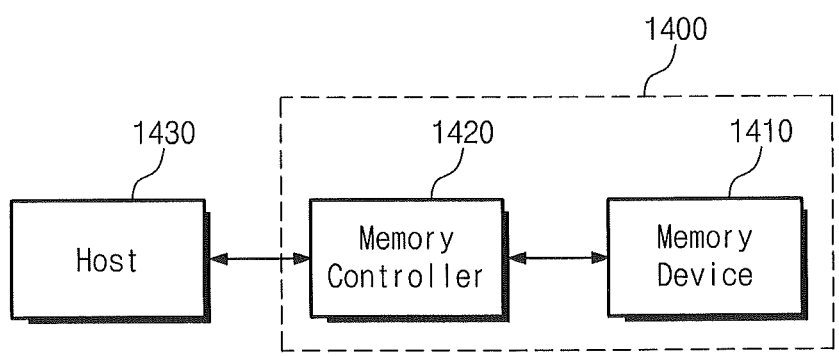

FIGS. 29 and 30 are block diagrams schematically illustrating electronic devices including a semiconductor device according to example embodiments of the inventive concept.

Referring to FIG. 29, an electronic device 1300 including a semiconductor device according to example embodiments of the inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal processor, a microcontroller or the like. The memory 1330 may be configured to store a command code to be used by the controller 1310 or a user data. The memory 1330 may include a semiconductor device according to example embodiments of the inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and the like.

Referring to FIG. 30, a memory system including a semiconductor device according to example embodiments of the inventive concept will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concept.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

According to example embodiments of the inventive concept, an operating method of a magnetic memory device may include applying an ambient magnetic field to a selected magnetic tunnel junction. As the result of the applying of the ambient magnetic field, it is possible to compensate for a stray field in a magnetic memory device or relieve technical problems, such as excessive or asymmetrical energy consumption.

According to other example embodiments of the inventive concept, an operating method of a magnetic memory device may include applying ambient magnetic and electric fields to a selected magnetic tunnel junction. By applying the ambient magnetic field, it is possible to shift selectively a resistance hysteresis loop of the magnetic tunnel junction. Accordingly, a voltage-induced magnetization switching can be realized using the ambient electric field.

While example embodiments of the inventive concept have been particularly shown and described, it will be understood by one of ordinary skill in the art that variations in form and detail may be made therein without departing from the spirit and scope of the attached claims.

What is claimed is:

1. A data writing method of a magnetic memory device, comprising:
   flowing first and second currents near left and right sides, respectively, of a selected memory cell to apply an ambient magnetic field to the selected memory cell, wherein directions of the first and second currents are anti-parallel to each other;
   wherein the magnetic memory device further comprises:
   a selected bit line connected to the selected memory cell;
   left wiring lines provided at a left side of the selected bit line;
   right wiring lines provided at a right side of the selected bit line;
   non-selected memory cells provided at left and right sides of the selected memory cell; and
   each of the left and right wiring lines serves as a non-selected bit line electrically connecting some of the non-selected memory cells arranged along a direction parallel to the selected bit line,
   wherein the first current is formed to flow through at least one of the left wiring lines adjacent to the selected bit line, and
   the second current is formed to flow through at least one of the right wiring lines adjacent to the selected bit line.

2. The method of claim 1, wherein the selected memory cell comprises a magnetic tunnel junction including a free layer, a fixed layer, and a tunnel barrier therebetween, and at least one of the free layer or the fixed layer is configured to exhibit a perpendicular magnetization property.

3. The method of claim 1, wherein the left and right wiring lines are parallel to the selected bit line.

4. The method of claim 1, wherein the magnetic memory device further comprises:
   non-selected memory cells provided at left and right sides of the selected memory cell; and
   non-selected bit lines connected to the non-selected memory cells,
   wherein each of the left and right wiring lines is disposed between the non-selected bit lines or between the selected and non-selected bit lines and is electrically separated from the selected and non-selected memory cells.

5. The method of claim 1, wherein the data writing method comprises AP-to-P and P-to-AP writing steps changing data stored in the selected memory cell;
   the AP-to-P writing step is performed to apply the ambient magnetic field having a first magnitude and a first direction to the selected memory cell; and
   the P-to-AP writing step is performed to apply the ambient magnetic field having a second magnitude and a second direction to the selected memory cell;
   wherein the first and second directions are anti-parallel to each other.

6. The method of claim 5, wherein the first and second magnitudes are substantially the same.

7. The method of claim 5, wherein the first and second magnitudes are different from each other within a range capable of preventing data stored in the selected memory cell from being changed.

8. The method of claim 1, wherein the data writing method comprises AP-to-P and P-to-AP writing operations changing data stored in the selected memory cell; and
   one of the AP-to-P and P-to-AP writing operations is performed to apply the ambient magnetic field having a finite magnitude to the selected memory cell, and the other AP-to-P and P-to-AP writing operation is performed without applying the ambient magnetic field to the selected memory cell.

9. The method of claim 1, wherein the magnetic memory device further comprises a selected bit line and a source line that are connected to opposite terminals, respectively, of the selected memory cell; and
   the data writing method further comprising changing data stored in the selected memory cell by using a spin-transfer torque current flowing through the selected memory cell through the selected bit line and the source line.

10. The method of claim 9, wherein changing data stored in the selected memory cell comprises AP-to-P and P-to-AP writing operations performed in such a way that directions of the spin-transfer torque currents are anti-parallel to each other.

11. The method of claim 1, wherein the selected memory cell comprises a magnetic tunnel junction including a free layer, a fixed layer, and a tunnel barrier therebetween, and the magnetic memory device further comprises a selected bit line and a source line connected to one or the free and fixed layers and the other, respectively; and
   the data writing method further comprising applying different voltages to the selected bit line and the source line to generate an ambient electric field between opposite terminals of the magnetic tunnel junction when the ambient magnetic field is applied to the selected memory cell.

12. The method of claim 11, wherein the data writing method further comprises AP-to-P and P-to-AP writing operations changing data stored in the selected memory cell; and
   wherein the ambient electric fields in the AP-to-P and P-to-AP writing operations are generated to have substantially the same direction.

13. A method, comprising:
   applying an ambient magnetic field to a magnetic tunnel junction of a magnetic memory device to select between an AP-to-P switching direction and a P-to-AP switching direction; and
   applying an ambient electric field to the magnetic tunnel junction to change data stored in the magnetic memory device.

14. The method of claim 13, wherein applying the ambient magnetic field comprises:
   shifting a hysteresis loop of the magnetic tunnel junction along a magnetic field axis.

15. The method of claim 14, wherein applying an ambient electric field to the magnetic tunnel junction comprises:
   changing a width of the hysteresis loop along the magnetic field axis.

16. The method of claim 13, wherein applying the ambient magnetic field comprises:
   generating first and second currents, which are anti-parallel to each other, near opposing sides of the magnetic tunnel junction; and
   wherein applying the ambient electric field comprises:
   generating a potential difference between terminals of the magnetic tunnel junction.

17. The method of claim 16, wherein the magnetic tunnel junction comprises a free layer, a fixed layer, and a tunnel barrier therebetween, and at least one of the free layer and the fixed layer is configured to exhibit a perpendicular magnetization property.

18. A data writing method of a magnetic memory device, comprising:

flowing first and second currents, which are anti-parallel to each other, near left and right sides, respectively, of a selected magnetic tunnel junction to apply an ambient magnetic field to the selected magnetic tunnel junction, wherein the ambient magnetic field is generated to reduce a difference in magnitude between writing currents that are required for AP-to-P and P-to-AP writing steps.

* * * * *